United States Patent [19]

Hlavka

[11] Patent Number: 4,752,737
[45] Date of Patent: Jun. 21, 1988

[54] PULSED GAS CONTROL FOR NMR SPINNER SPEED ADJUSTMENT

[75] Inventor: Lloyd F. Hlavka, Palo Alto, Calif.

[73] Assignee: Varian Associates, Inc., Palo Alto, Calif.

[21] Appl. No.: 84,943

[22] Filed: Aug. 13, 1987

Related U.S. Application Data

[62] Division of Ser. No. 768,548, Aug. 23, 1985, Pat. No. 4,706,029.

[51] Int. Cl.[4] .......................................... G01R 33/20
[52] U.S. Cl. .................................................... 324/321
[58] Field of Search ................ 307/308; 324/321, 164, 324/167, 161, 173; 73/507, 19; 415/16, 32, 118

[56] References Cited

U.S. PATENT DOCUMENTS 4,112,683  9/1978  Bess ....................................... 73/507

Primary Examiner—Michael J. Tokar
Attorney, Agent, or Firm—Stanley Z. Cole; Kenneth L. Warsh; Edward H. Berkowitz

[57] ABSTRACT

A system for controlling the spin rate of a sample in an NMR spectrometer using an ON/OFF valve controlled by a digital system to regulate flow of a gas between a source and a sample spinner. A spin rate detector supplies rate information to the digital control. The digital control varies the ON/OFF valve duty cycle to control the spin rate.

1 Claim, 1 Drawing Sheet

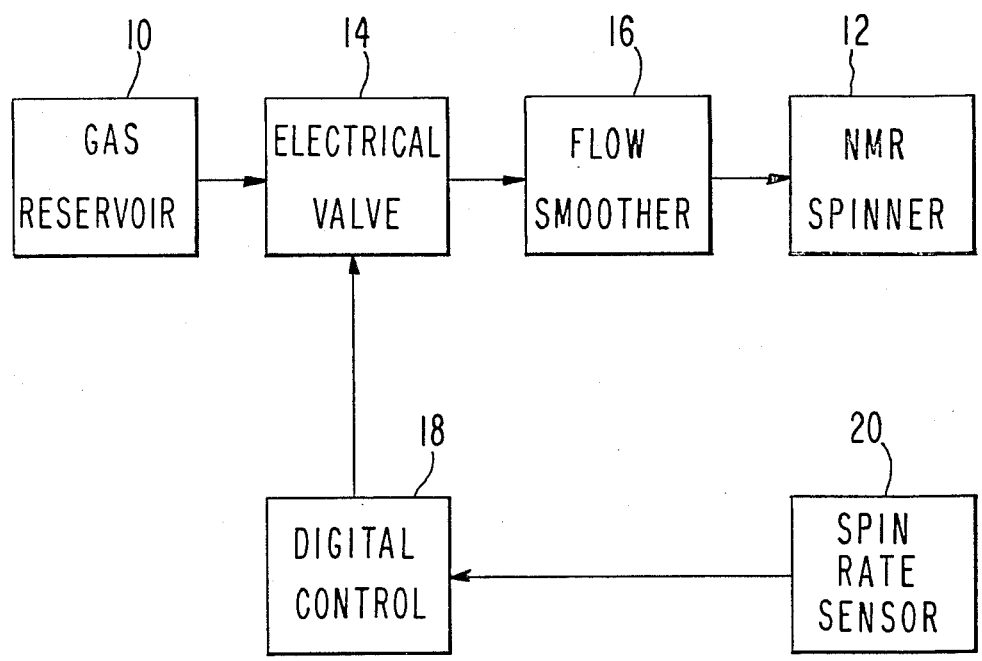

PULSED GAS CONTROL FOR NMR SPINNER SPEED ADJUSTMENT

This is a division of application Ser. No. 768,548, filed Aug. 23, 1985, now U.S. Pat. No. 4,706,029.

FIELD OF THE INVENTION

This invention relates to an apparatus for controlling the spin rate of a sample in an NMR apparatus, and more particularly, to a digitally controlled gaseous drive for a sample spinner.

BACKGROUND OF THE INVENTION

In the prior art, rotational speed of the sample in an NMR spectrometer was controlled by a flow of gas which was adjusted by a multiturn needle. This was satisfactory for manual operation, but with an automated machine, electronic control of gas is needed. Air flow in an automated machine was controlled by a servo system operating the multiturn needle air valve. This servo system typically consists of mechanical linkages, motors, amplifiers, and associated electronics.

OBJECTS OF THE INVENTION

An object of the invention is to provide a control system for spinning the NMR sample which eliminates the linkages, motors, amplifiers and much of the electronics of the prior art.

A further object of the invention is to provide a control system for spinning the NMR sample which is easily adaptable to control by a digital signal.

SUMMARY OF THE INVENTION

Gas flow to a sample spinner is controlled by a fast electrically operated on/off valve. Pulses of gas are injected into a flow smoother which may consist only of the connecting tubing. The on/off valve is controlled by a digital system which bases its control on information derived from data derived from the spinning sample.

These and further constructional and operational characteristics of the invention will be more evident from the detailed description given hereinafter with reference to the accompanying drawing which illustrate one preferred embodiment by way of non-limiting examples.

BRIEF DESCRIPTION OF THE DRAWING

FIG. 1 shows a block diagram of the system according to the invention.

DESCRIPTION OF THE PREFERRED EMBODIMENT

Referring now to the drawing wherein reference numerals are used to designate parts throughout, there is shown in FIG. 1 a block diagram of the system according to the invention. A gas reservoir 10 provides a source of gas to drive the sample spinner 12. A fast electrical on/off valve 14 is used to release pulses of gas from the reservoir 10. The pulses of gas are injected into a flow smoother 16 which is a tank which may be equipped with baffles or other flow restricting devices as required by the system. A digital control 18 is used to drive the on/off valve 14. The information on which the control is based is derived from a spin rate sensor 20. The spin rate sensor 20 might be, for example, an optical detector operating together with a light to sense marks on the sample.

The average flow of gas is a function of the duty cycle of the on/off valve. Typical times are 8 milliseconds "on" and a much longer "off" time, typically, 48 milliseconds "off". An adjustable "off" time, which is equivalent to a change of frequency, can be used to control the average flow of gas. This on/off flow control is well adaptable to computer or microprocessor control because of the on/off nature of digital signals.

This invention is not limited to the preferred embodiment heretofore described, to which variations and improvements may be made including mechanically and electrically equivalent modifications to component parts, without departing from the scope of protection of the present patent and true spirit of the invention, the characteristics of which are summarized in the following claims.

What is claimed is:

1. In an NMR spectrometer, the method of maintaining the rotational rate of a gas actuated sample spinner turbine at a desired rotational rate, comprising:

opening and closing a single valve between a pressurized gas source and said sample spinner turbine to form pressure pulses of gas at a selected pulse repetition rate;

smoothing the flow of said pressurized pulses of gas, causing said sample spinner turbine to rotate by impinging said sample spinner turbine with said smoothed pressure pulses of gas;

monitoring said rate of rotation of said sample spinner turbine to obtain a measured value of the rotation rate of said sample spinner turbine;

comparing said measured value with said desired value in developing an error signal to represent the difference thereof;

changing said pulse repetition rate in accordance with said error signal to more closely conform said measured rate to said desired rate.

* * * * *